United States Patent
Khan et al.

(10) Patent No.: US 7,923,850 B2
(45) Date of Patent: Apr. 12, 2011

(54) SEMICONDUCTOR CHIP WITH SOLDER JOINT PROTECTION RING

(75) Inventors: Mohammad Khan, Saratoga, CA (US); Jun Zhai, San Jose, CA (US); Ranjit Gannamani, San Jose, CA (US); Raj N. Master, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 57 days.

(21) Appl. No.: 12/198,227

(22) Filed: Aug. 26, 2008

(65) Prior Publication Data
US 2010/0052188 A1    Mar. 4, 2010

(51) Int. Cl.
*H01L 23/448*    (2006.01)
*H01L 21/56*    (2006.01)

(52) U.S. Cl. .................................................. 257/778

(58) Field of Classification Search .............. 257/778, 257/704, 710, E21.502, 678–733, 787–796, 257/E23.001–E23.194; 438/15, 26, 51, 55, 438/64, 106, 124–127, E21.499–E21.519
See application file for complete search history.

(56) References Cited

U.S. PATENT DOCUMENTS

| | | | |
|---|---|---|---|
| 5,866,943 A | 2/1999 | Mertol | |
| 6,046,077 A | 4/2000 | Baba | |
| 6,051,888 A * | 4/2000 | Dahl | 257/778 |
| 6,114,048 A * | 9/2000 | Jech et al. | 428/547 |
| 6,114,763 A | 9/2000 | Smith | |
| 6,224,711 B1 | 5/2001 | Carden | |
| 6,313,521 B1 | 11/2001 | Baba | |
| 6,317,333 B1 * | 11/2001 | Baba | 361/795 |
| 6,445,062 B1 | 9/2002 | Honda | |
| 6,509,630 B1 | 1/2003 | Yanagisawa | |
| 6,703,704 B1 * | 3/2004 | Alcoe et al. | 257/688 |
| 6,756,685 B2 | 6/2004 | Tao | |
| 6,944,945 B1 | 9/2005 | Shipley et al. | |
| 6,979,636 B1 | 12/2005 | Lin et al. | |
| 7,102,228 B2 * | 9/2006 | Kanda | 257/730 |
| 7,196,426 B2 * | 3/2007 | Nakamura et al. | 257/778 |
| 2001/0017408 A1 | 8/2001 | Baba | |
| 2002/0114144 A1 | 8/2002 | Kumamoto et al. | |
| 2003/0025180 A1 * | 2/2003 | Alcoe et al. | 257/659 |
| 2003/0178722 A1 | 9/2003 | Xie et al. | |

(Continued)

FOREIGN PATENT DOCUMENTS

JP    9283889    10/1997

(Continued)

OTHER PUBLICATIONS

U.S. Appl. No. 11/748,618, filed May 15, 2007, Eric Tosaya.

(Continued)

*Primary Examiner* — Dao H Nguyen
*Assistant Examiner* — Tram H Nguyen
(74) *Attorney, Agent, or Firm* — Timothy M. Honeycutt

(57) ABSTRACT

Various semiconductor chip arrangements and methods of making the same are disclosed. In one aspect, a method of manufacturing is provided that includes coupling a semiconductor chip that has an external peripheral wall to a first side of a substrate. A first metallic ring is coupled to the first side of the substrate. The first metallic ring has an internal peripheral wall that frames the semiconductor chip and is separated from the external peripheral wall by a gap. The first metallic ring has a coefficient of thermal expansion less than about 6.0 $10^{-6}$ $K^{-1}$.

23 Claims, 5 Drawing Sheets

U.S. PATENT DOCUMENTS

| | | | |
|---|---|---|---|
| 2004/0099958 | A1 | 5/2004 | Schildgen et al. |
| 2004/0150118 | A1 | 8/2004 | Honda |
| 2005/0230797 | A1 | 10/2005 | Ho et al. |
| 2005/0282310 | A1 | 12/2005 | Zhou |
| 2006/0208356 | A1 | 9/2006 | Yamano et al. |
| 2006/0249852 | A1 | 11/2006 | Chiu et al. |
| 2008/0001308 | A1 | 1/2008 | Chen |
| 2008/0054490 | A1 | 3/2008 | McLellan et al. |
| 2008/0142996 | A1 | 6/2008 | Subramanian et al. |
| 2008/0272482 | A1* | 11/2008 | Jensen et al. .......... 257/705 |

FOREIGN PATENT DOCUMENTS

| | | |
|---|---|---|
| JP | 3161706 | 8/2000 |
| JP | 3180794 | 4/2001 |
| JP | 3189270 | 5/2001 |
| JP | 3219043 | 8/2001 |
| JP | 3228339 | 9/2001 |
| JP | 2002190560 | 7/2002 |
| JP | 3367554 | 11/2002 |
| JP | 3384359 | 12/2002 |
| JP | 3385533 | 1/2003 |
| JP | 2003051568 | 2/2003 |
| JP | 3459804 | 8/2003 |
| JP | 2004260138 | 9/2004 |
| JP | 200767010 | 3/2007 |

OTHER PUBLICATIONS

U.S. Appl. No. 12/029,305, filed Feb. 11, 2008, Eric Tosaya.

U.S. Appl. No. 12/051,330, filed Mar. 19, 2008, Roden Topacio.

Horatio Quinones et al.; *Flip Chip Encapsulation Reliability*; ASYMTEK; Aug. 1998; pp. 1-13.

Richard Blish, Ph.D.; *Use Condition Based Reliability Evaluation of New Semiconductor Technologies*; SEMATECH; Aug. 31, 1999; pp. 1-21.

National Electronics Center of Excellence; *Empfasis-Lead Free Soldering for Sustainment*; A publication of the National Electronics Manufacturing Center for Excellence; http://www.empf.org/empfasis/oct03/3403pbsustain.htm; Mar./Apr. 2003; pp. 1-3.

K.C. Norris et al.; *Reliability of Controlled Collapse Interconnections*; IBM J. Res. Development; May 1969; pp. 1-6.

Werner Engelmaier; *Solder Joints in Electronics: Design for Reliability*; 1999; pp. 1-13.

USPTO Office Action mailed Mar. 27, 2009; U.S. Appl. No. 11/748,618.

U.S. Appl. No. 12/435,147, filed May 4, 2009, Stephen Heng et al.

PCT/IB2009/000561 International Search Report.

USPTO Office Action notification date Aug. 17, 2009; U.S. Appl. No. 11/748,618.

Lisa Kosanovic; *New Wires for Old*; http://www.memagazine.org/supparch/pejun04/newwires/newwires.html; Mechanical Engineering "Power & Energy,"; Jun. 2004; pp. 1-5.

Wikipedia; *Invar*; http://en.wikipedia.org/wiki/Invar; unknown date*; pp. 1-2.

*Invar*; http://asuwlink.uwyo.edu/-metal/invar.html; Aug. 11, 2007; pp. 1-3.

David R. Lide; *CRC Handbook of Chemistry and Physics; 79th Edition*; 1998; pp. 12-191 thru 12-192.

\* cited by examiner

SEMICONDUCTOR CHIP WITH SOLDER JOINT PROTECTION RING

BACKGROUND OF THE INVENTION

1. Field of the Invention

This invention relates generally to semiconductor processing, and more particularly to semiconductor chip with a substrate and solder joint protection ring.

2. Description of the Related Art

Flip-chip techniques are frequently used to mount a semiconductor chip or die to a substrate of one sort or another, such as a package substrate or other type of circuit board. In a typical conventional process, plural solder joints are formed between the chip and the substrate by selective solder bump deposition on both the chip and the substrate followed by a reflow to merge the sets of bumps.

Solder joint fatigue is one of the key reliability issues related to flip-chip assembly on organic substrates. Solder joint fatigue is a function of several factors including: (1) large coefficient of thermal expansion (CTE) mismatch between a silicon die and the package substrate; (2) die size; (3) various geometrical factors related to the solder bumps, such as shape, size and height; (4) underfill and substrate material properties; and (5) the types of thermal cycling the joints must endure.

Die size is closely related to solder joint stress. The stresses on solder joints increase linearly from nearly zero at the die center or neutral point to some higher value near the edges of the die. However, the outermost solder joints, those that are most distant from the die center or neutral point, are subjected to the maximum stresses. The stresses are highest for those joints located at the die corners. The jump in stresses at the very edges of the die has been termed the "edge effect".

One conventional technique for addressing the edge effect involves the use of sacrificial dummy bumps. As the name implies, dummy bumps are not connected to chip circuitry, but are instead set aside for reinforcement. Dummy bumps do help. But because they occupy sites that could otherwise be used for input/output, routing is constrained. If routing is to be maintained, then the die size must be increased with an attendant penalty in terms of material and processing cost.

The present invention is directed to overcoming or reducing the effects of one or more of the foregoing disadvantages.

SUMMARY OF THE INVENTION

In accordance with one aspect of the present invention, a method of manufacturing is provided that includes coupling a semiconductor chip that has an external peripheral wall to a first side of a substrate. A first metallic ring is coupled to the first side of the substrate. The first metallic ring has an internal peripheral wall that frames the semiconductor chip and is separated from the external peripheral wall by a gap. The first metallic ring has a coefficient of thermal expansion less than about 6.0 $10^{-6}$ $K^{-1}$.

In accordance with another aspect of the present invention, a method of manufacturing is provided that includes coupling a semiconductor chip to a first side of a substrate. The semiconductor chip has a first footprint and the substrate has a second footprint. A first metallic ring is formed with an internal footprint larger than the first footprint of the semiconductor chip and an external footprint smaller than the second footprint of the substrate, and with a coefficient of thermal expansion less than about 6.0 $10^{-6}$ $K^{-1}$. The first metallic ring is coupled to the first side of the substrate to frame the semiconductor chip.

In accordance with another aspect of the present invention, an apparatus is provided that includes a semiconductor chip coupled to a first side of a substrate and that has an external peripheral wall. A first metallic ring is coupled to the first side of the substrate. The first metallic ring has an internal peripheral wall that frames the semiconductor chip and is separated from the external peripheral wall by a gap. The first metallic ring has a coefficient of thermal expansion less than about 6.0 $10^{-6}$ $K^{-1}$.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
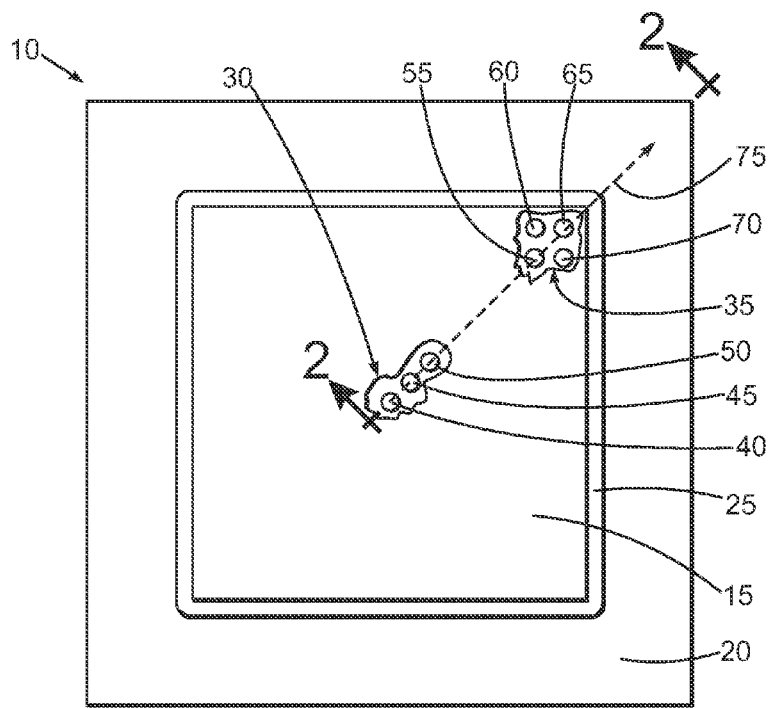
FIG. 1 is an overhead view of an exemplary conventional semiconductor chip package that includes a semiconductor chip or die mounted on a package substrate.

In the drawings described below, reference numerals are generally repeated where identical elements appear in more than one figure. Turning now to the drawings, and in particular to FIG. 1, therein is shown an overhead view of an exemplary conventional semiconductor chip package 10 that includes a semiconductor chip or die 15 mounted on a package substrate 20 in flip-chip fashion so that the surface of the chip 15 facing out of the page is the backside of the chip 15. A small portion of an underfill material layer 25 is visible at the peripheral edges of the chip 15. The chip 15 is interconnected electrically with the package substrate 20 by way of a plurality of solder joints, a few of which are made visible by cut away sections 30 and 35 of the chip 15. The cut away section 30 reveals three solder joints 40, 45 and 50 while the cut away section 35 reveals four solder joints 55, 60, 65 and 70. The solder joint 40 is located at the so-called neutral point of the chip 15. As described more fully below, the neutral point position for the solder joint 40 is approximately at the center of the combination of the package substrate 20 and the chip 15 and thus constitutes the point of smallest strain due to thermal expansion of any of the solder joints in the package 10. Note that a dashed axis 75 is drawn from the solder joint 40 at the neutral point through the solder joints 45, 50, 55 and 65. The axis 75 will be used in conjunction with the next figure to describe the effects of differences in coefficient of thermal expansion between the chip 15 and the package substrate 20 and its effect on the strains imposed on the various solder joints of the package 10.

Figure 2:
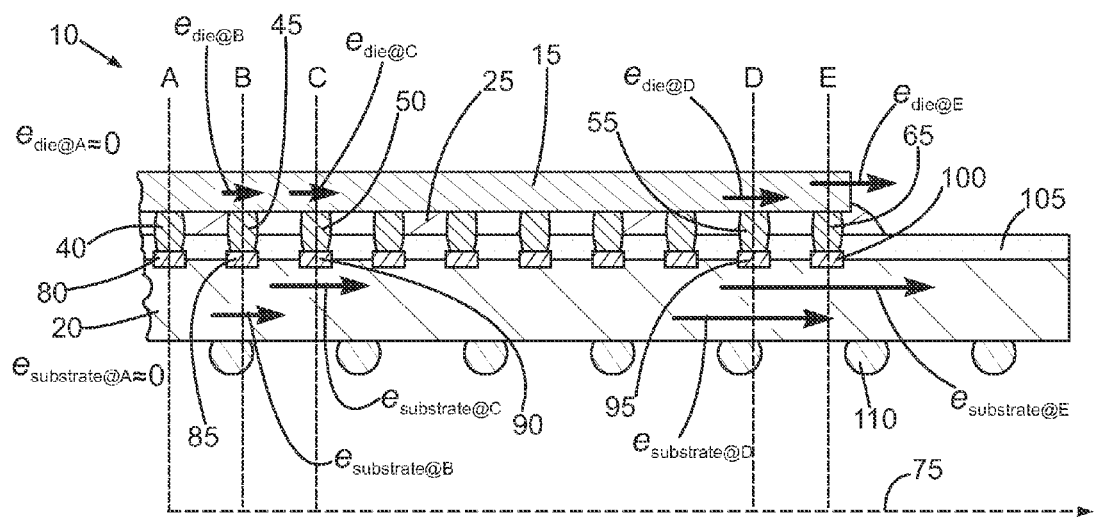
FIG. 2 is a sectional view of FIG. 1 taken at section 2-2.

Attention is now turned to FIG. 2, which is a sectional view of FIG. 1 taken at section 2-2. Note that the position of section 2-2 passes through the solder joint 40 and is positioned generally in the same place as the axis 75. The positions of the solder joints 40, 45, 50, 55 and 65 along the axis 75 are labeled A, B, C, D and E respectively. Additional solder joints are depicted but not separately labeled. The solder joints 40, 45, 50, 55 and 65 are metallurgically coupled to respective conductor pads 80, 85, 90, 95 and 100 in the substrate 20. A solder mask 105 is positioned on the substrate 20 and used to facilitate the manufacture of the solder joints 45, 50, etc. using well-known techniques. The underfill material layer 25 that is visible in FIG. 1 only in a peripheral sense, extends beneath the entirety of the interface between the chip 15 and the substrate and in particular the solder mask 105 thereof. The substrate 20 is depicted as a ball grid array, and thus includes plural solder balls 110 that are interconnected electrically with the solder joints 40, 45, 50, 55 and 65 by way of plural interconnect and via layers in the substrate 20 that are not visible.

In a typical conventional chip package 10 that includes an organic style substrate 20 and a silicon chip 15, the chip 15 has a coefficient of thermal expansion of about $3.0 \ 10^{-6} \ K^{-1}$ and the substrate 20 has a coefficient of thermal expansion of about 15.0 to $20.0 \ 10^{-6} \ K^{-1}$. Thus, when the package 10 is heated, the chip 15 and the package substrate 20 will undergo strain at markedly different rates. Not only will the chip 15 and the substrate 20 strain at different rates but the rates of strain along the axis 75 will vary as well. This so-called edge effect is illustrated graphically using vectors that represent strain as follows. The strain $e_{die@A}$ of the die 15 at point A, which is the neutral point, is approximately zero. Similarly, the strain $e_{substrate@A}$ of the substrate 20 at point A is also approximately zero. However, proceeding from left to right along the axis 75 at points B and C the strains in the die 15 and the substrate 20 begin to increase. Thus, the die strain $e_{die@B}$ at point B has some value represented by a vector and the die strain $e_{die@C}$ at point C represented by another vector has some value that is larger than the strain $e_{die@B}$ at point B. Similarly, the strain $e_{substrate@B}$ in the substrate 20 at point B has some value that is typically larger than the die strain $e_{die@B}$ at point B due to the higher CTE of the substrate 20, and the strain $e_{substrate@C}$ of the substrate 20 at point C is still larger than at point B again due to the fact that strain tends to increase with increasing distance from the neutral point A in a flattened structure that is undergoing thermal strain. Proceeding further left to right along the axis 75 to the point D, the strain $e_{die@D}$ of the die 15 at point D is correspondingly larger than the strain $e_{die@C}$ in the die 15 at point C. Finally, at the outermost solder joint 65, the strain $e_{die@E}$ is the largest value of strain in the die 15. Similarly, the strains in the substrate 20 at points D and E are represented by the vectors $e_{substrate@D}$ and $e_{substrate@E}$ and are successively larger still than the strain $e_{substrate@C}$ in the substrate 20 at point C. Again, note the difference in strain at point E between the substrate and the die. The fall out of these increasingly large strains and the difference between the strains of the substrate 20 and the die 15 at a given point produce relatively large shearing forces and stresses in the solder joints 40, 45, 50, 55 and 65, and particularly at the joints at the edge or corner namely the solder joints 55 and 65. While the effect would be pronounced anywhere along the edge of the die 15, such as those joints 60 and 70 depicted in FIG. 1 but not visible in FIG. 2, the effect is particularly pronounced at the corners and thus for the solder joints 55 and 65.

As noted in the Background section hereof, one conventional technique for trying to alleviate the problematic effects of high solder joint stress and strain, particularly at the edges of a die, is to fabricate the outermost solder joints, such as the joints 60 and 70 depicted in FIG. 1 and 65 depicted in FIGS. 1 and 2, to be dummy bumps that are not electrically interconnected to other circuit structures.

Figure 3:
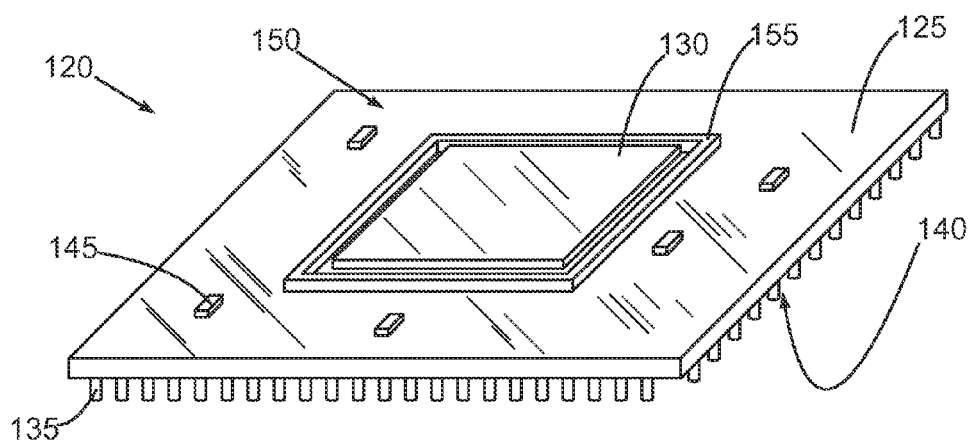
FIG. 3 is a pictorial view of an exemplary embodiment of a semiconductor chip mounted on a substrate with a chip protection ring.

An exemplary embodiment of a chip package 120 may be understood by referring now to FIG. 3, which is a pictorial view. The package 120 includes a package substrate 125 upon which a semiconductor chip or die 130 is mounted. The die 130 may configured as virtually any type of device, such as a microprocessor, a graphics processor, a combined microprocessor/graphics processor, memory devices, an application specific integrated circuit or the like. Such devices may be multiple core and multiple dice. The chip 130 is depicted as being mounted in a flip-chip fashion, however, multiple dice could be stacked or mounted to the substrate 125 in a stack or unstacked configuration as desired.

The substrate 125 may interconnect electrically with some other device, such as a circuit board, by way of variety of interconnect schemes. In this illustrative embodiment, a pin grid array consisting of a plurality of conductor pins 135 projecting from the substrate 125 is used to interface the package 120 with another device, such as another circuit board (not shown). However, other interconnect schemes, such as a ball grid array, a land grid array or others may be used. Plural passive devices, one of which is separately labeled 145, may be coupled to the package substrate 125 on either the upper surface 150 thereof or at other locations on or in the substrate 125 as desired. The passive devices may be capacitors, inductors, resistors or other devices as desired. Structurally speaking, the substrate 125 may be composed of ceramics or organic materials. If an organic design is selected, the substrate 125 may consist of a core/build-up configuration. In this regard, the substrate 125 may consist of a central core upon which one or more build-up layers are formed and below which an additional one or more build-up layers are formed. The core itself may consist of a stack of one or more layers. One example of such an arrangement may be termed a so called "4-4-4" arrangement where a four-layer core laminated between two sets of four build-up layers. The number of layers in the substrate 125 can vary from four to sixteen or more, although less than four may be used. So-called "coreless" designs may be used as well. The layers of the substrate 125 consist of an insulating material, such as various well-known epoxies, interspersed with metal interconnects.

To address the issue of solder joint stress due to the differences in CTE between the chip 130 and the substrate 125, the package 120 is fitted with a solder joint protective ring 155 that is slightly larger in footprint than the die 130, smaller in external footprint than the substrate 125, and advantageously fabricated from a material that has a CTE that closely approximates that of the die 130. In this way, the ring 155 compels the package 120 to behave from a thermal strain standpoint as if the ring 155 and the chip 130 were a single structural feature.

Figure 4:
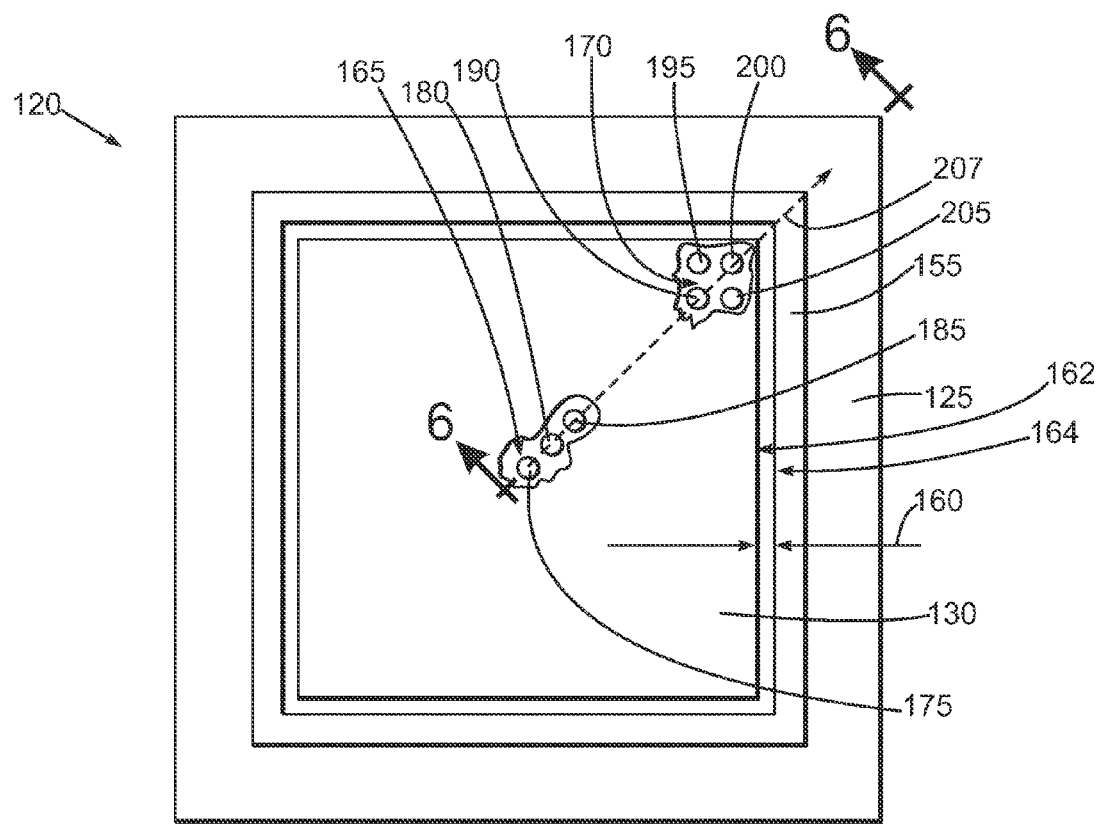
FIG. 4 is an overhead view of the semiconductor chip mounted to the substrate.

Additional detail of the package 120 may be understood by referring now to FIG. 4, which is an overhead view. The ring 155 frames the semiconductor chip 130. In this regard, the ring 155 is provided with an internal footprint that is slightly larger than the footprint of the chip 130 so as to leave a gap 160 between an external peripheral wall 162 of the chip 130 and an internal peripheral wall 164 of the ring 155. The size of the gap 160 is advantageously relatively small, say on the order of 1.0 mm or perhaps smaller. Two portions 165 and 170 of the chip 130 are shown cut away to reveal solder joints 175, 180, 185, 190, 195, 200 and 205. The solder joint 175 is located at the neutral point for the package 120 and the solder joint 200 is located at a corner of the die 130 at the extreme most distance from the neutral point associated with the joint 175.

Figure 5:
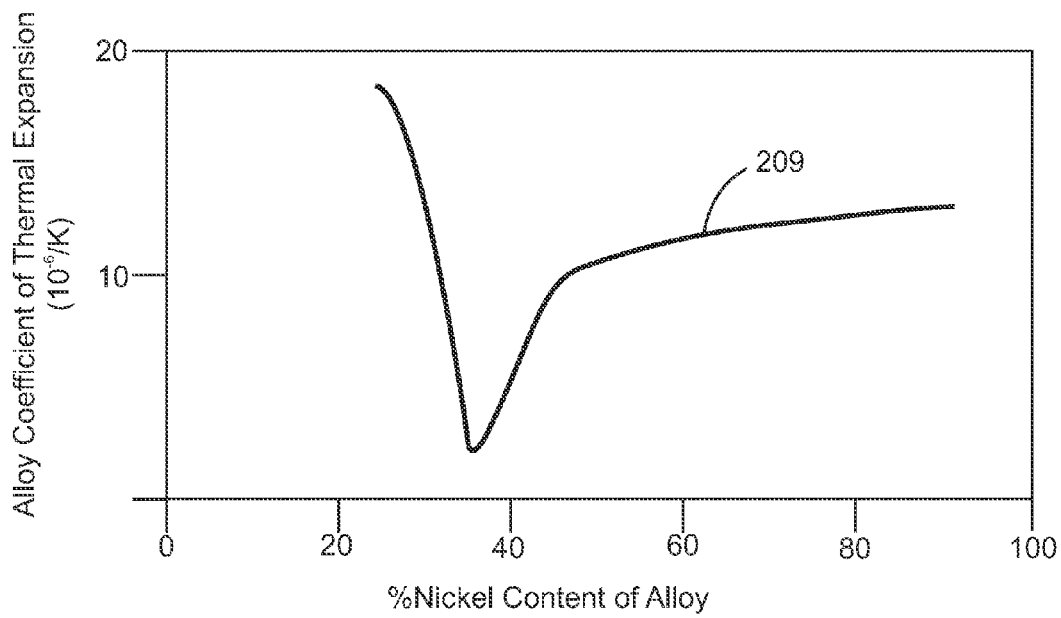
FIG. 5 is a plot of coefficient of thermal expansion versus nickel content for an exemplary chip protection ring.

The ring 155 is advantageously composed of a material or combination of materials that exhibits a CTE that approximates the CTE of the die 130. One exemplary material is a steel-nickel alloy sometimes known in the industry as Invar®. Interestingly, a steel-nickel alloy exhibits a CTE that varies greatly with nickel concentration. The variability is depicted in FIG. 5, which is a plot 209 of alloy CTE (in units of $10^{-6}$ $K^{-1}$) as a function of nickel concentration. As the plot 209 shows, a nickel concentration of about 36% yields a minimum alloy CTE of about 1.2 to 1.5 $10^{-6}$ $K^{-1}$. The nickel concentration may be raised to about 38 to 40% or lowered to about 35 to 36% to yield a CTE in a range of about 3.0 to 4.0 $10^{-6}$ $K^{-1}$, which matches well with a silicon CTE of about 3.0 $10^{-6}$ $K^{-1}$. If composed of steel nickel alloy, the ring 155 may be shaped by punching, forging, or other well-known machining techniques or via casting or powder metallurgy. Other candidates include tungsten (CTE of about 4.5 $10^{-6}$ $K^{-1}$), molybdenum (CTE of about 4.8 $10^{-6}$ $K^{-1}$), chromium (CTE of about 4.9 $10^{-6}$ $K^{-1}$) and hafnium (CTE of about 5.9 $10^{-6}$ $K^{-1}$). The same types of fabrication techniques may be used with these alternate materials, however, ductility considerations may place limits on machining.

Figure 6:
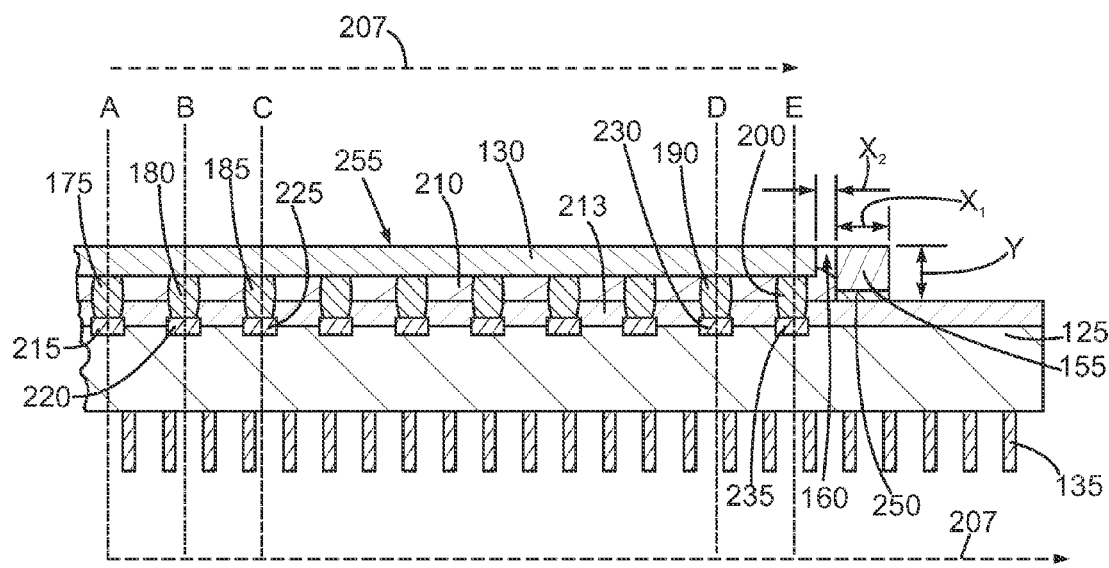
FIG. 6 is a sectional view of FIG. 4 taken at section 6-6.

Still further details of the package 120 may be understood by referring now also to FIG. 6, which is a sectional view of FIG. 4 taken at section 6-6. Note that a few of the pin grid array pins 135 are visible. An underfill material layer 210 is formed in the interface between the chip 130 and a solder mask 213 that is positioned on the substrate 125. The underfill material layer 210 may be composed of well-known epoxy resins with or without silica or other fillers and deposited using well-known capillary force or injection techniques. Two examples are types 8437-2 and 2BD supplied by Namics. The solder joints 175, 180, 185, 190 and 200 are located at points A, B, C, D and E along the axis 207, respectively, where point A is the die neutral point. Additional solder joints are depicted but not separately labeled. The joints 175, 180, 185, 190 and 200 are metallurgically connected to respective conductor pads 215, 220, 225, 230 and 235 in the substrate 125. The joints 175, 180, 185, 190 and 200 may consist of the metallurgical combination of solder bumps attached to the die 130 and a pre-solders positioned in the solder mask 213. The bumps and pre-solders are brought together and a reflow is performed to yield the joints 175, 180, 185, 190 and 200. Lead-based solders, such as lead-tin solders at or away from eutectic proportions, or lead-free solders, such as tin-silver (about 97.3% Sn 2.7% Ag), tin-copper (about 99% Sn 1% Cu), tin-silver-copper (about 96.5% Sn 3% Ag 0.5% Cu) or the like. The pads 215, 220, 225, 230 and 235 may be composed of a variety of materials, such as, for example copper, nickel, gold, platinum, silver, alloys of these or the like. In an exemplary embodiment, the pads 215, 220, 225, 230 and 235 are composed of a stack of copper, nickel and gold.

The ring 155 may be secured to the substrate 125 and in particular the solder mask 235 thereof by way of an adhesive bead 250. The adhesive 250 may be for example, a well-known thixotropic adhesive or other type of package adhesive as desired. The total thickness Y of the adhesive bead 250 and the ring 155 may be about the same as the height of the upper surface 255 of the chip 130 above the solder mask 235. The suitable width $X_1$ of the ring 155 will depend on the size of the die 130, the CTE of the substrate 125, and the CTE of the ring 155. In an exemplary embodiment, the width $X_1$ may be about 1.5 to 3.5 mm. As noted above, the width $X_2$ of the gap 160 between the edge of the chip 130 and the ring 155 may be on the order of a fraction of a millimeter or so. The ring 155 may be secured to the substrate 125 before or after the deposition of the underfill material layer 240 as desired. The strains in the chip 130 and the substrate 125 during heating will be generally similar, though not identical to the strains depicted in FIG. 2 for the conventional design. However, the presence of the ring 155 in the illustrative embodiment depicted in FIGS. 3, 4 and 6 effectively resists some of the strain in the substrate 125 along the axis 207 so that the amount of stress and strain imparted on the outermost solder joint 200 is lessened over that provided by the conventional design depicted in FIG. 2.

The impact of the width $X_2$ of the gap 160 on solder joint stress was modeled by computer using ANSYS software. Still referring to FIG. 6, the modeling calculated joint stress in the joints positioned along the axis 207 proceeding from the neutral point A to the corner joint 200 at point E without the protective ring 155 and with the protective ring 155 dimensioned to yield three different gap widths $X_2$. The inputs to the model are set forth in the following table.

TABLE

| | |
|---|---|
| Die area $A_{DIE}$ | 470 mm$^2$ |
| Die material | silicon on insulator |
| Die thickness | 775 μm |
| Die CTE | 3.0 $10^{-6}$ K$^{-1}$ |
| Underfill Material | Namics 2BD |
| Underfill thickness | 70 μm |
| Underfill CTE | 33.0 $10^{-6}$ K$^{-1}$ |
| Package substrate area | 1600 mm$^2$ |
| Package substrate configuration | 4 × 4 × 4 buildup organic land grid array |
| Package substrate CTE | 20.0 $10^{-6}$ K$^{-1}$ |
| Protective ring wall thickness $X_1$ | 2.0 mm |
| Protective ring wall height including adhesive Y | 845 μm |
| Gap width $X_2$ | 0.5 mm, 1.0 mm and 2.0 mm |
| Protective ring CTE | 3.0 $10^{-6}$ K$^{-1}$ |

Figure 7:
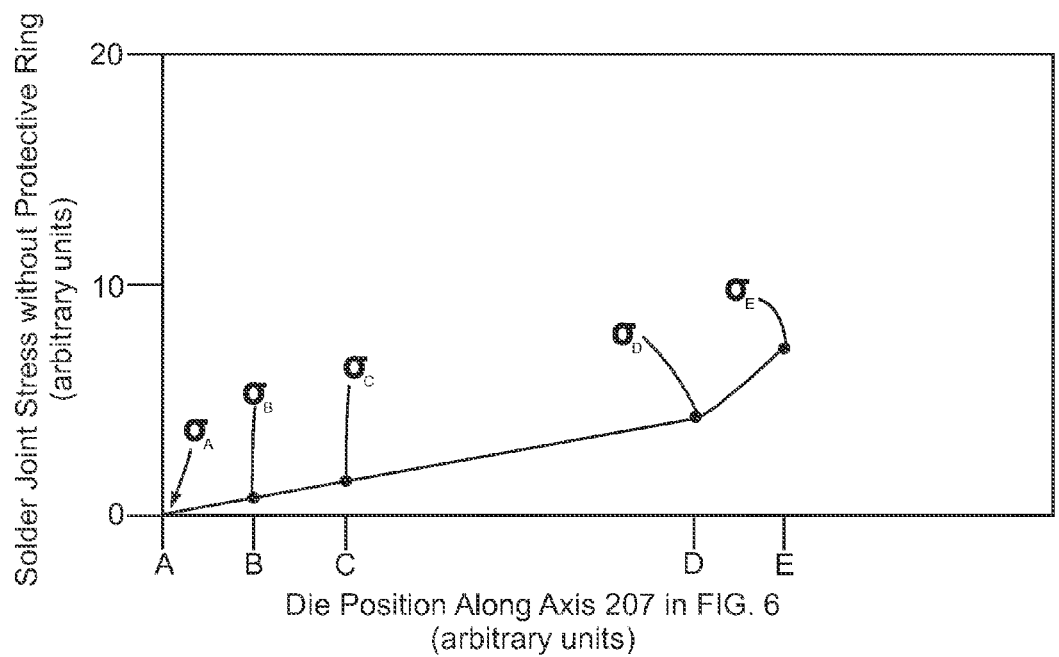
FIG. 7 is a plot of chip solder joint stress versus die location for an exemplary semiconductor chip package without a chip protection ring.
Figure 8:
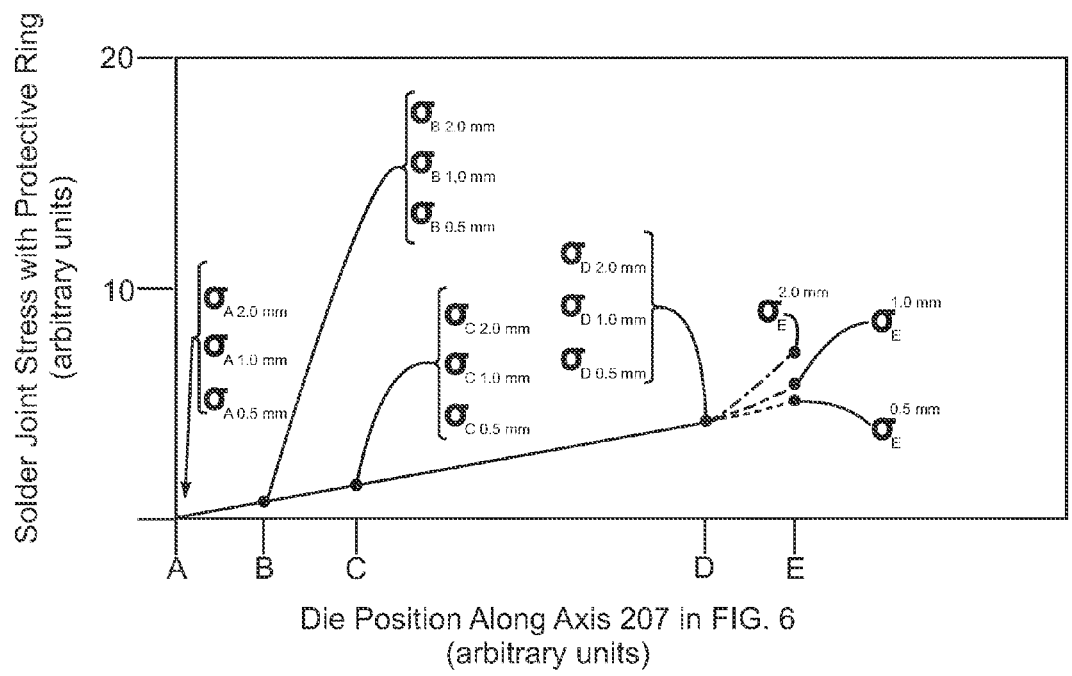
FIG. 8 is a plot of chip solder joint stress versus die location for an exemplary semiconductor chip package with a chip protection ring.
Figure 9:
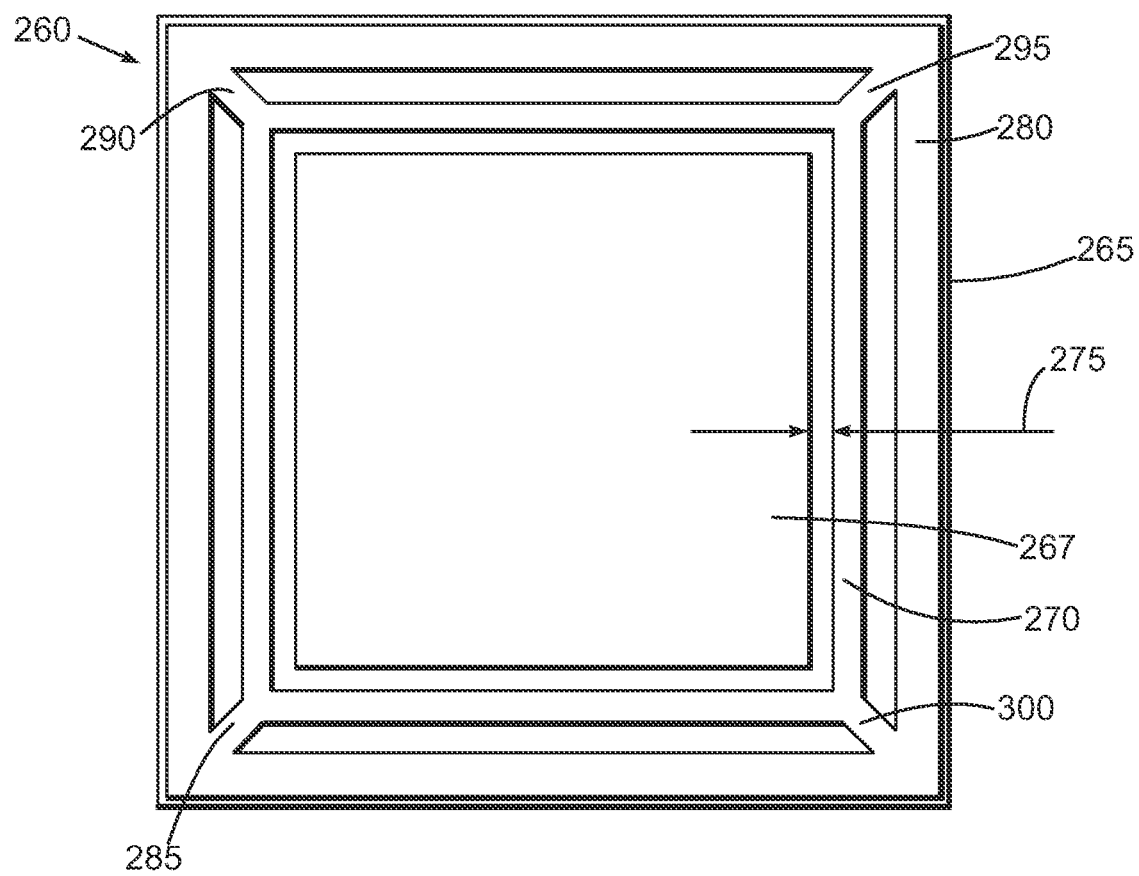
FIG. 9 is an overhead view of an alternate exemplary embodiment of a semiconductor chip mounted on a substrate with an alternate exemplary chip protection ring.

The results of the modeling are illustrated graphically in the plots in FIGS. 7 and 8. The plot in FIG. 7 shows solder joint stress in arbitrary units, and without a protective ring, versus die position along the axis 207 shown in FIG. 6. The position A corresponds to the neutral point and the position E corresponds to the position of the outermost corner solder joint 200 in FIG. 6. The joint stress $\sigma_A$ at point A is essentially zero. The joint stresses $\sigma_B$, $\sigma_C$ and $\sigma_D$ at points B, C and D progressively increase in a linear fashion. However, the joint stress $\sigma_E$ at point E, the last joint 200 in FIG. 6, jumps by perhaps 25 to 30%. The plots in FIG. 8 show solder joint stress in arbitrary units, with a protective ring, versus die position along the axis 207 shown in FIG. 6. Joint stress values are plotted for each positions A, B, C, D and E and for each gap $X_2$ width 0.5 mm, 1.0 mm and 2.0 mm. For example, $\sigma_{A\ 0.5\ mm}$ is the joint stress at point A for a 0.5 mm gap width, $\sigma_{A\ 1.0\ mm}$ is the joint stress at point A for a 1.0 mm gap, $\sigma_{A\ 2.0\ mm}$ is the joint stress at point A for a 2.0 mm gap, and so on for the other positions and gap widths. The joint stresses $\sigma_{A\ 0.5\ mm}$, $\sigma_{A\ 1.0\ mm}$ and $\sigma_{A\ 2.0\ mm}$ at point A are all essentially zero. The joint stresses $\sigma_{B\ 0.5\ mm}$, $\sigma_{B\ 1.0\ mm}$ and $\sigma_{B\ 2.0\ mm}$ at point B are approximately the same, the joint stresses $\sigma_{C\ 0.5\ mm}$, $\sigma_{C\ 1.0\ mm}$ and $\sigma_{C\ 2.0\ mm}$ at point C are approximately the same and the joint stresses $\sigma_{D\ 0.5\ mm}$, $\sigma_{D\ 1.0\ mm}$ and $\sigma_{D\ 2.0\ mm}$ at point D are approximately the same. There is a generally linear upward trend going from the neutral point A to the outer point D. However, the benefits of the protective ring are apparent in the shift from point D to point E. Note that the joint stress $\sigma_{E\ 0.5\ mm}$ at point E for a 0.5 mm gap width tracks the general linear trend of points A through D. In other words, the joint stress at point E does not exhibit the sharp upward spike in joint stress observed at point E in FIG. 7 where a protective ring is not used. The joint stress $\sigma_{E\ 1.0\ mm}$ at point E for a 1.0 mm gap width ticks up slightly but still generally avoids the sharp upward spike shown in FIG. 7. The joint stress $\sigma_{E\ 2.0\ mm}$ at point E for a 2.0 mm gap shows the same general upward spike in joint stress for the outermost joint observed in FIG. 7. The reduction in joint stress at point E using the protective ring 155 shown in FIGS. 4 and 6 falls off when the gap width $X_2$ exceeds about 1.0 mm. A ratio $X_2/A_{DIE}$ of gap width $X_2$ to die area $A_{DIE}$ may be useful to characterize desirable gap sizes. Thus for a die area $A_{DIE}$ of 470 mm² and the useful range of gap width $X_2$ of approximately zero to about 1.0 mm, the ratio $X_2/A_{DIE}$ could range from approximately zero to about 1.0 mm/470 mm² or about 0.00213.

An overhead view of an alternate exemplary embodiment of a semiconductor chip package 260 is shown in FIG. 7. The package 260 includes a semiconductor chip package substrate 265 upon which a semiconductor chip 267 is mounted. Both the package substrate 265 and the chip 267 may be configured as generally described elsewhere herein. In this illustrative embodiment, a protective ring 270 may be placed around the chip 265 with a footprint sufficiently large to leave a gap 275 between the ring 270 and the chip 267. In this respect, the ring 270 may be configured substantially like the single ring 155 depicted in FIGS. 3, 4 and 6. However, an optional outer ring 280 composed of the same types of materials used to compose the inner ring 270 may be attached to the substrate and further, may be optionally mechanically connected to the inner ring 270 by way of corner-positioned extensions 285, 290, 295 and 300.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
    coupling a semiconductor chip to a first side of a substrate, the semiconductor chip having an external peripheral wall and a first coefficient of thermal expansion, the substrate having a second coefficient of thermal expansion; and
    coupling a first metallic ring to the first side of the substrate, the first metallic ring having an internal peripheral wall that frames the semiconductor chip and is separated from the external peripheral wall by a gap, the first metallic ring having a coefficient of thermal expansion nearer to the first coefficient of thermal expansion than to the second coefficient of thermal expansion and less than about $6.0\ 10^{-6} K^{-1}$.

2. The method of claim 1, wherein the coupling the semiconductor chip comprises flip-chip mounting.

3. The method of claim 1, comprising applying an underfill between the semiconductor chip and the substrate.

4. The method of claim 3, wherein the underfill is applied after the first metallic ring is coupled to the substrate.

5. The method of claim 1, wherein the semiconductor chip has an area, a ratio of a size of the gap to the area being less than about 0.00213.

6. The method of claim 1, wherein the gap is less than about 1.0 mm.

7. The method of claim 1, wherein the first metallic ring comprises an alloy of about 64% steel and about 36% nickel.

8. The method of claim 1, comprising coupling a second ring to the first side of the substrate that frames the first metallic ring.

9. A method of manufacturing, comprising:
    coupling a semiconductor chip to a first side of a substrate, the semiconductor chip having a first coefficient of thermal expansion and a first footprint, the substrate having a second coefficient of thermal expansion and a second footprint;
    forming a first metallic ring with an internal footprint larger than the first footprint of the semiconductor chip and an external footprint smaller than the second footprint of the substrate, the first metallic ring having a coefficient of thermal expansion nearer to the first coefficient of thermal expansion than to the second coefficient of thermal expansion and less than about $6.0\ 10^{-6}\ K^{-1}$.

10. The method of claim 9, wherein the coupling the semiconductor chip comprises flip-chip mounting.

11. The method of claim 9, comprising applying an underfill between the semiconductor chip and the substrate.

12. The method of claim 11, wherein the underfill is applied after the first metallic ring is coupled to the substrate.

13. The method of claim 9, wherein the semiconductor chip has an area, there being a gap between the semiconductor chip and the first metallic ring, a ratio of a size of the gap to the area being less than about 0.00213.

14. The method of claim 9, wherein there is gap between the semiconductor chip and the first metallic ring of less than about 1.0 mm.

15. The method of claim 9, wherein the first metallic ring comprises an alloy of about 64% steel and about 36% nickel.

16. The method of claim 9, comprising coupling a second ring to the first side of the substrate that frames the first metallic ring.

17. An apparatus, comprising:
    a semiconductor chip coupled to a first side of a substrate and having an external peripheral wall, the semiconductor chip having a first coefficient of thermal expansion, the substrate having a second coefficient of thermal expansion; and
    a first metallic ring coupled to the first side of the substrate, the first metallic ring having an internal peripheral wall that frames the semiconductor chip and is separated from the external peripheral wall by a gap, the first metallic ring having a coefficient of thermal expansion nearer to the first coefficient of thermal expansion than to the second coefficient of thermal expansion and less than about $6.0\ 10^{-6} K^{-1}$.

18. The apparatus of claim 17, wherein the semiconductor chip is flip-chip mounted to the substrate.

19. The apparatus of claim 17, comprising applying an underfill between the semiconductor chip and the substrate.

20. The apparatus of claim 17, wherein the semiconductor chip has an area, a ratio of a size of the gap to the area being less than about 0.00213.

21. The apparatus of claim 17, wherein the gap is less than about 1.0 mm.

22. The apparatus of claim 17, wherein the first metallic ring comprises an alloy of about 64% steel and about 36% nickel.

23. The apparatus of claim 17, comprising a second ring coupled to the first side of the substrate that frames the first metallic ring.

* * * * *